(12) United States Patent
Kawahara

(10) Patent No.: US 8,089,200 B2
(45) Date of Patent: Jan. 3, 2012

(54) PIEZOELECTRIC VIBRATING DEVICES AND METHODS FOR MANUFACTURING SAME

(75) Inventor: Hiroshi Kawahara, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 12/859,202

(22) Filed: Aug. 18, 2010

(65) Prior Publication Data

US 2011/0062825 A1    Mar. 17, 2011

(30) Foreign Application Priority Data

Sep. 16, 2009   (JP) .................................. 2009-213926

(51) Int. Cl.
*H01L 41/08* (2006.01)
(52) U.S. Cl. ........................................ 310/344; 310/348
(58) Field of Classification Search .................. 310/340, 310/344, 348, 367
See application file for complete search history.

(56) References Cited

U.S. PATENT DOCUMENTS

| | | | | | |
|---|---|---|---|---|---|
| 3,339,091 | A | * | 8/1967 | Hammond et al. | 310/346 |
| 4,293,986 | A | * | 10/1981 | Kobayashi et al. | 29/25.35 |
| 4,639,632 | A | * | 1/1987 | Nakata et al. | 310/353 |
| 6,407,485 | B1 | * | 6/2002 | Aratake | 310/344 |
| 7,589,458 | B2 | * | 9/2009 | Aratake | 310/370 |
| 7,932,662 | B2 | * | 4/2011 | Saito | 310/344 |

FOREIGN PATENT DOCUMENTS

JP       2008-182468        8/2008

* cited by examiner

*Primary Examiner* — Mark Budd
(74) *Attorney, Agent, or Firm* — Klarquist Sparkman, LLP

(57) ABSTRACT

An exemplary piezoelectric device includes a piezoelectric vibrating piece, on which excitation electrodes are formed, and a piezoelectric frame having a frame portion surrounding the piezoelectric vibrating piece. A plate (e.g., lid or base) is bonded to one surface of the frame portion. Fitting members are provided on both the frame and the plate. When the piezoelectric frame and plate are brought together for assembly, the fitting members fit together (e.g., interdigitate) to provide quick and error-free alignment. Then, the fitting members are bonded together by a bonding material.

15 Claims, 7 Drawing Sheets

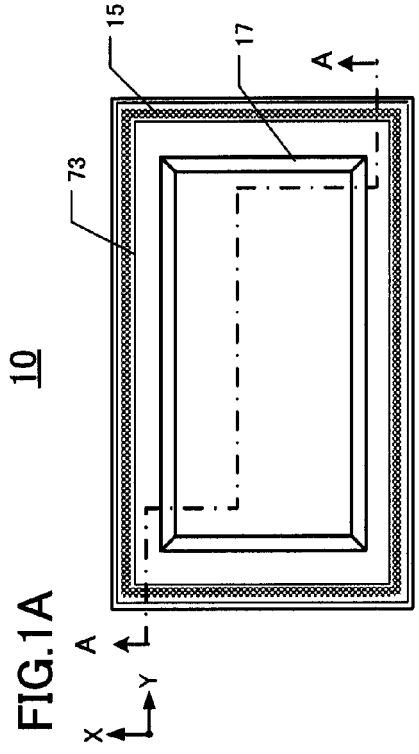
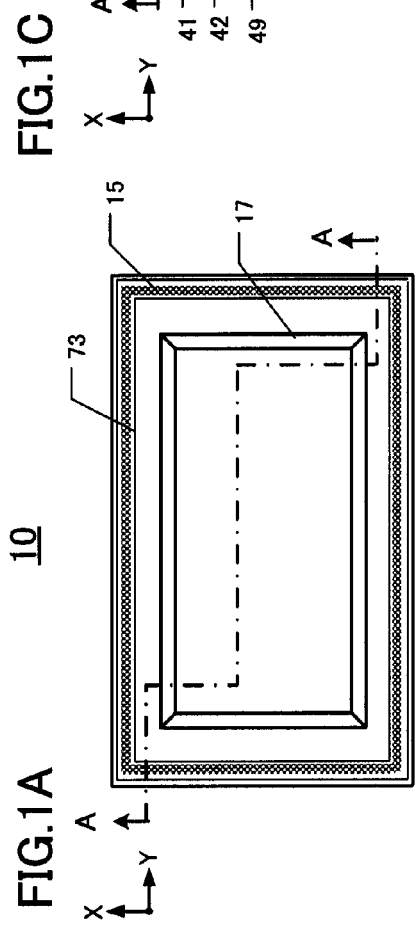
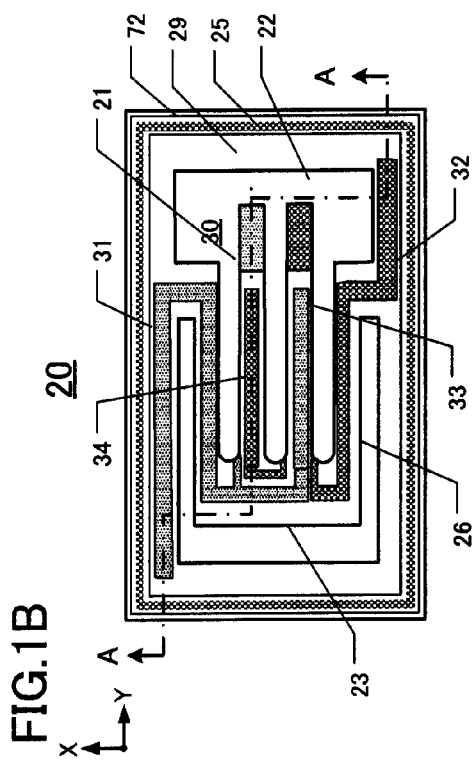
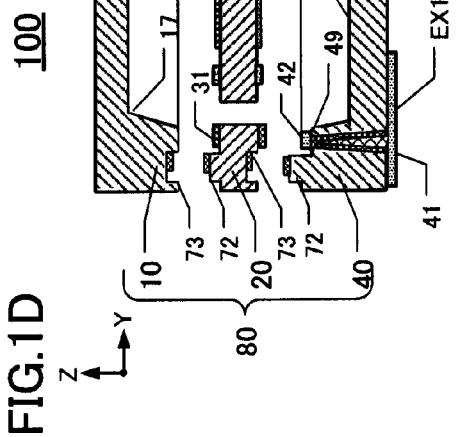
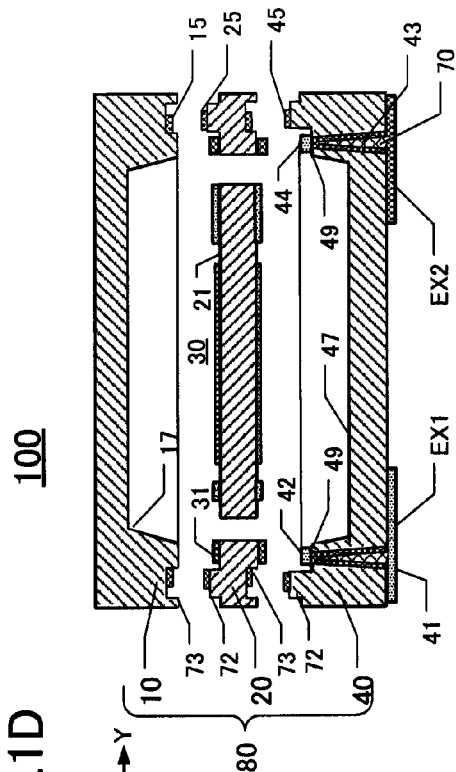

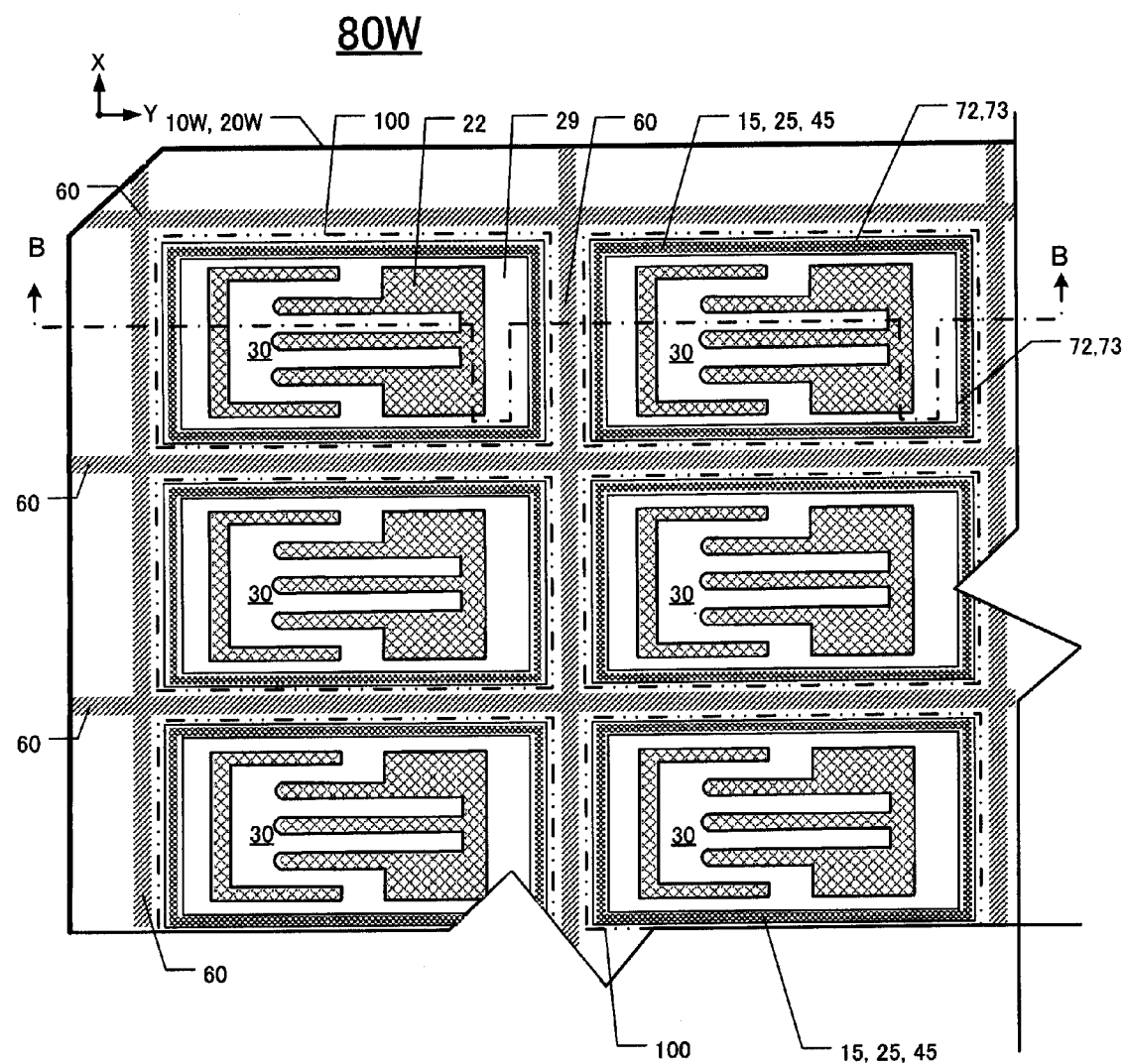

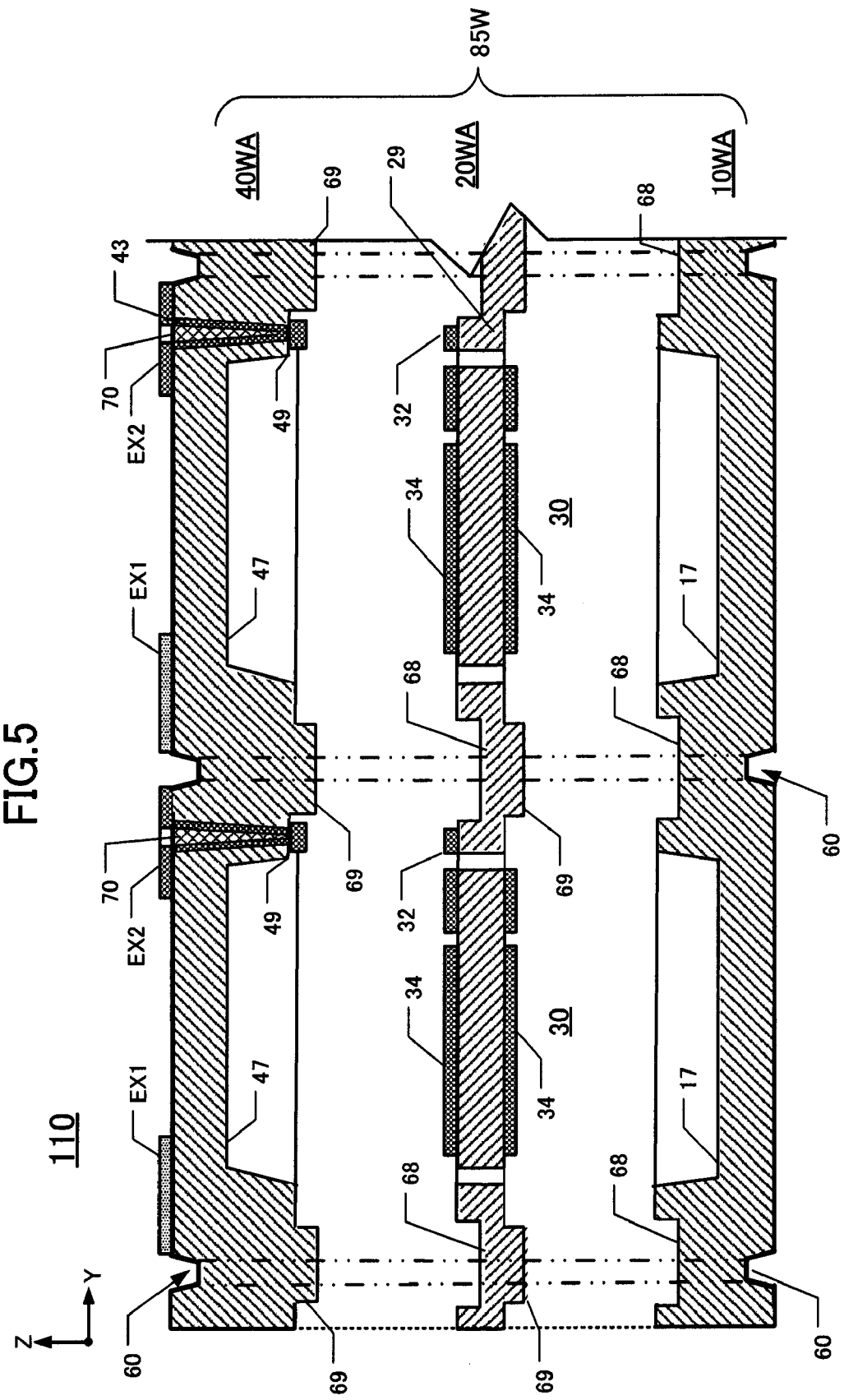

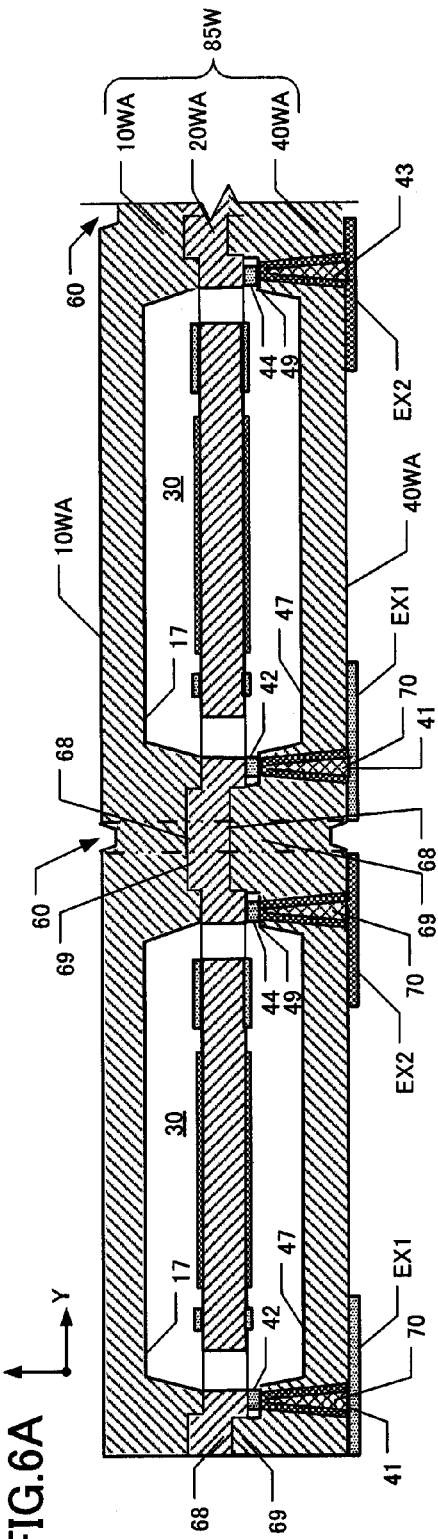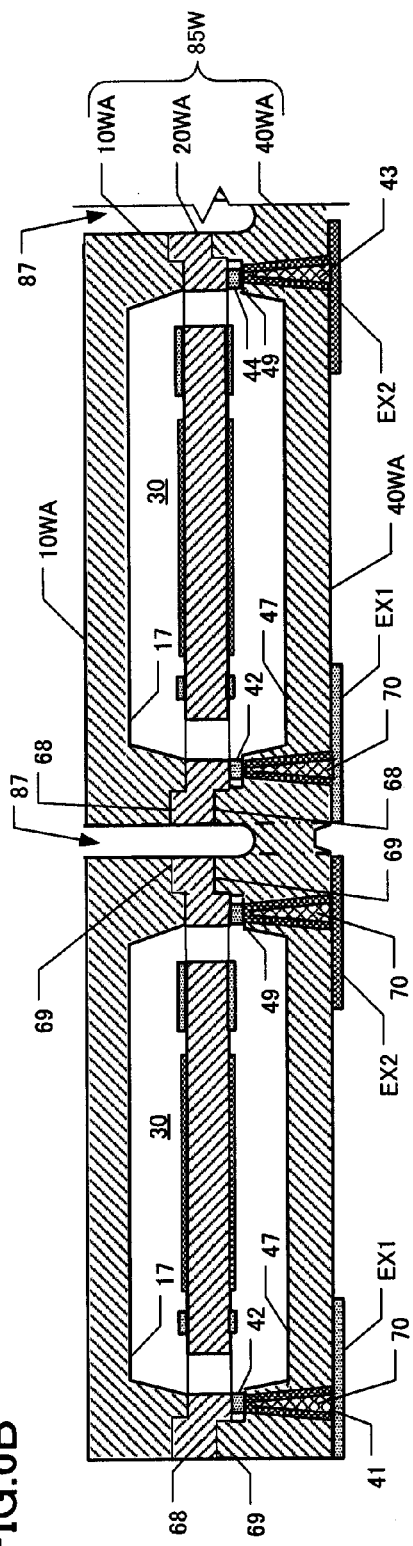
FIG.6A
FIG.6B

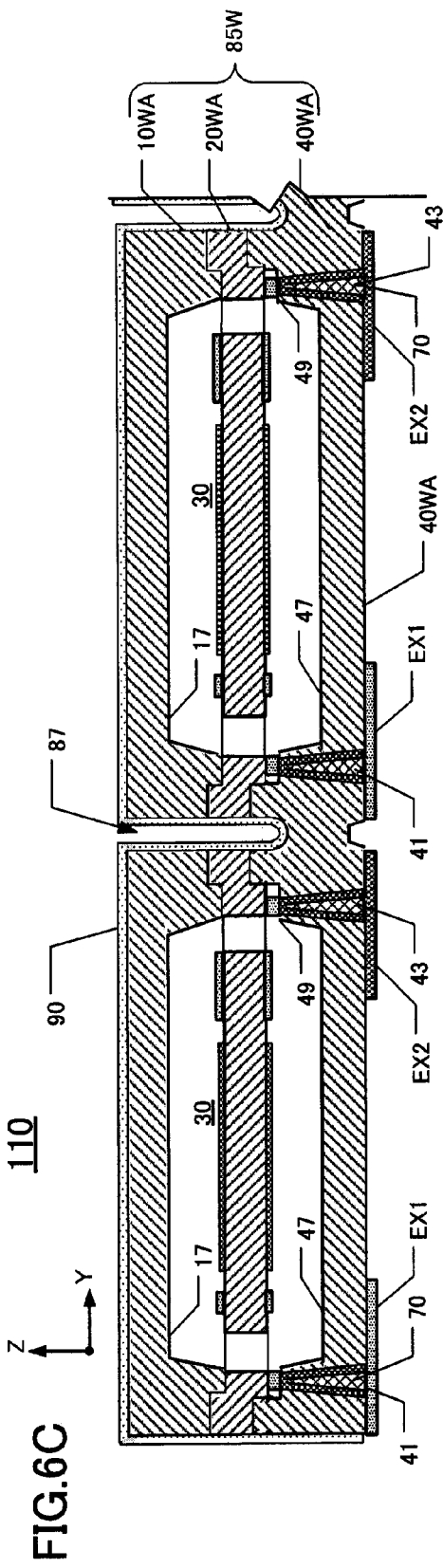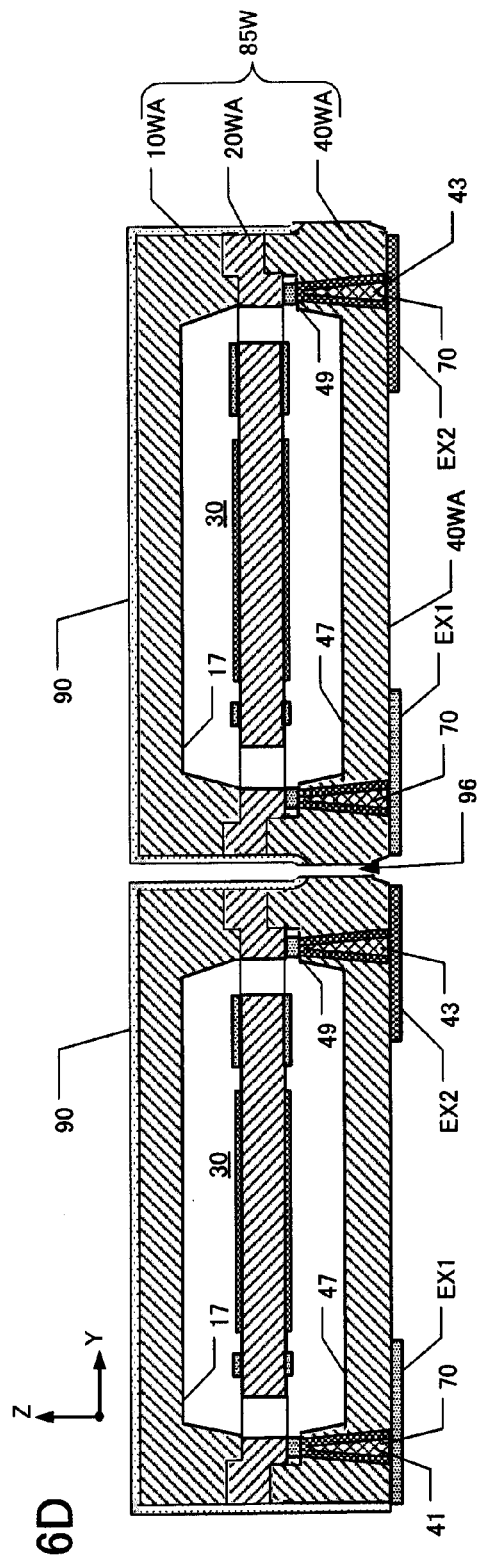

PIEZOELECTRIC VIBRATING DEVICES AND METHODS FOR MANUFACTURING SAME

CROSS-REFERENCE TO RELATED APPLICATION

This application claims priority to and the benefit of Japan Patent Application No. 2009-213926, filed on Sep. 16, 2009, in the Japan Patent Office, the disclosure of which is incorporated herein by reference in its entirety.

FIELD

This disclosure relates to, inter alia, piezoelectric vibrating devices and methods for manufacturing them, particularly in a manner suitable for mass-production.

DESCRIPTION OF THE RELATED ART

Nowadays, crystal vibrating devices used in mobile communications devices and/or OA equipment must increasingly be miniaturized, provided with a thinner profile, and/or made to operate at a higher frequency so as to be correspondingly accommodated in electronic devices that likewise are increasingly miniaturized, provided with a thinner profile, and/or made to operate at a higher frequency. Also, for economic viability, devices satisfying these criteria must be mass-producible at increasingly lower cost.

Certain methods for manufacturing piezoelectric vibrating devices are disclosed in Japan Unexamined Patent Application No. 2008-182468. Each device includes a "package" including a lid. Each lid is mounted on a respective guiding portion on a "package wafer" on which a plurality of packages has been formed, wherein each package accommodates a respective piezoelectric vibrating piece. During manufacture each lid and package are fitted together by the guiding portion, and each package is hermetically sealed. Then, each package is cut from the package wafer, thereby producing multiple individual piezoelectric devices. The method disclosed in JP '468 can prevent misalignment of the package base and lid. However, in the method of JP '468ed in JP '468, multiple packages are formed integrally on a single wafer, whereas the lids are formed individually. As a result, each lid must be mounted individually on its respective package on the wafer, which imposes additional manufacturing steps to produce the piezoelectric vibrating devices.

In view of the above, methods as disclosed herein increase productivity of piezoelectric vibrating devices while providing such devices that exhibit high stability of vibrational frequency for long periods.

SUMMARY

A first aspect of the invention pertains to piezoelectric vibrating devices. An exemplary device comprises a piezoelectric frame that includes a piezoelectric vibrating piece on which excitation electrodes are formed and a frame portion surrounding the piezoelectric vibrating piece. The device also includes a plate (e.g., a base plate or lid plate) bonded to one surface of the frame portion of the piezoelectric frame. A respective fitting member is formed on the frame portion and on the plate. The fitting members are configured to engage each other (e.g., interdigitate or fit one within the other) whenever the piezoelectric frame and plate are aligned and brought together for assembly. In the device the respective fitting members are bonded together by a bonding material. The fitting members can include respective metal films, in which event the bonding material can comprise a metal material. Alternatively, the bonding material can be a resin material (e.g., an epoxy resin), in which event the metal films are not required in the fitting members. Desirably a corrosion-resistant film is formed on the exterior of the piezoelectric vibrating device. The corrosion-resistant film comprises an inorganic oxide film, a nitride film, or a nitric oxide film, or a combination thereof.

The plate can comprise glass, ceramic, or a piezoelectric material. The piezoelectric vibrating piece can be an AT-cut crystal vibrating piece or a tuning-fork type crystal vibrating piece.

In a representative embodiment of a method for manufacturing the subject piezoelectric devices, a piezoelectric wafer is prepared that defines multiple piezoelectric vibrating pieces and respective frame portions surrounding each piezoelectric vibrating piece. Each piezoelectric vibrating piece comprises at least one excitation electrode, and each frame portion defines first fitting members. Also prepared is a plate wafer that defines multiple plates sized substantially similarly to respective frame portions on the piezoelectric wafer. Each plate defines second fitting members configured to physically engage (e.g., interdigitate with or fit one within the other) with respective first fitting members whenever the plate wafer is aligned with and brought together with the piezoelectric wafer. A bonding material is placed between the first fitting members and the second fitting members. The piezoelectric wafer and the plate wafer are aligned and bonded them together using the placed bonding material, thereby forming a package wafer.

By this method, a plurality of devices can be manufactured simultaneously on a single package wafer, thereby improving manufacturing efficiency.

After bonding, the bonded wafer can be cut along the outside periphery of the frame portion. A slit can be formed that extends between the first fitting member and the second fitting member. A corrosion-resistant film can be formed on the slit. The corrosion-resistant film desirably includes at least one of an inorganic oxide, a nitride, or a nitric oxide. At least one of the films is formed by chemical vapor deposition or sputtering.

The bonded wafer ("package wafer") can be cut along the slit using a narrower blade than used to cut the slit.

Using the subject methods, multiple devices can be formed simultaneously on a single package wafer while improving the stability and durability of the piezoelectric devices thus produced.

BRIEF DESCRIPTION OF THE DRAWINGS

FIG. 1A is a plan view of the inner surface of a lid for use in the package of a first embodiment of a crystal vibrating device.

FIG. 1B is a plan view of a crystal frame of the first embodiment, the crystal frame including a tuning-fork type crystal vibrating piece.

FIG. 1C is a plan view of the inner surface of a base for use in the package of a first embodiment of a crystal vibrating device.

FIG. 1D is an elevational section along the line A-A in FIGS. 1A-1C.

FIG. 2 is a plan view of a package wafer comprising multiple crystal vibrating devices, as viewed from the lid side, according to the first embodiment.

FIG. 5 is an enlarged elevational section along the line C-C of FIG. 4, showing a portion of the package wafer before actually bonding the three constituent wafers together.

FIG. 6A is an enlarged elevational section along the line D-D of FIG. 4.

FIG. 6B is the same as FIG. 6A but after a cut has been made between two adjacent crystal vibrating devices.

FIG. 6C is the same as FIG. 6B but after a corrosion-resistant film has been formed.

FIG. 6D is the same as FIG. 6C but after a cut has been made that completely separates the devices from each other.

DETAILED DESCRIPTION

Figure 3:
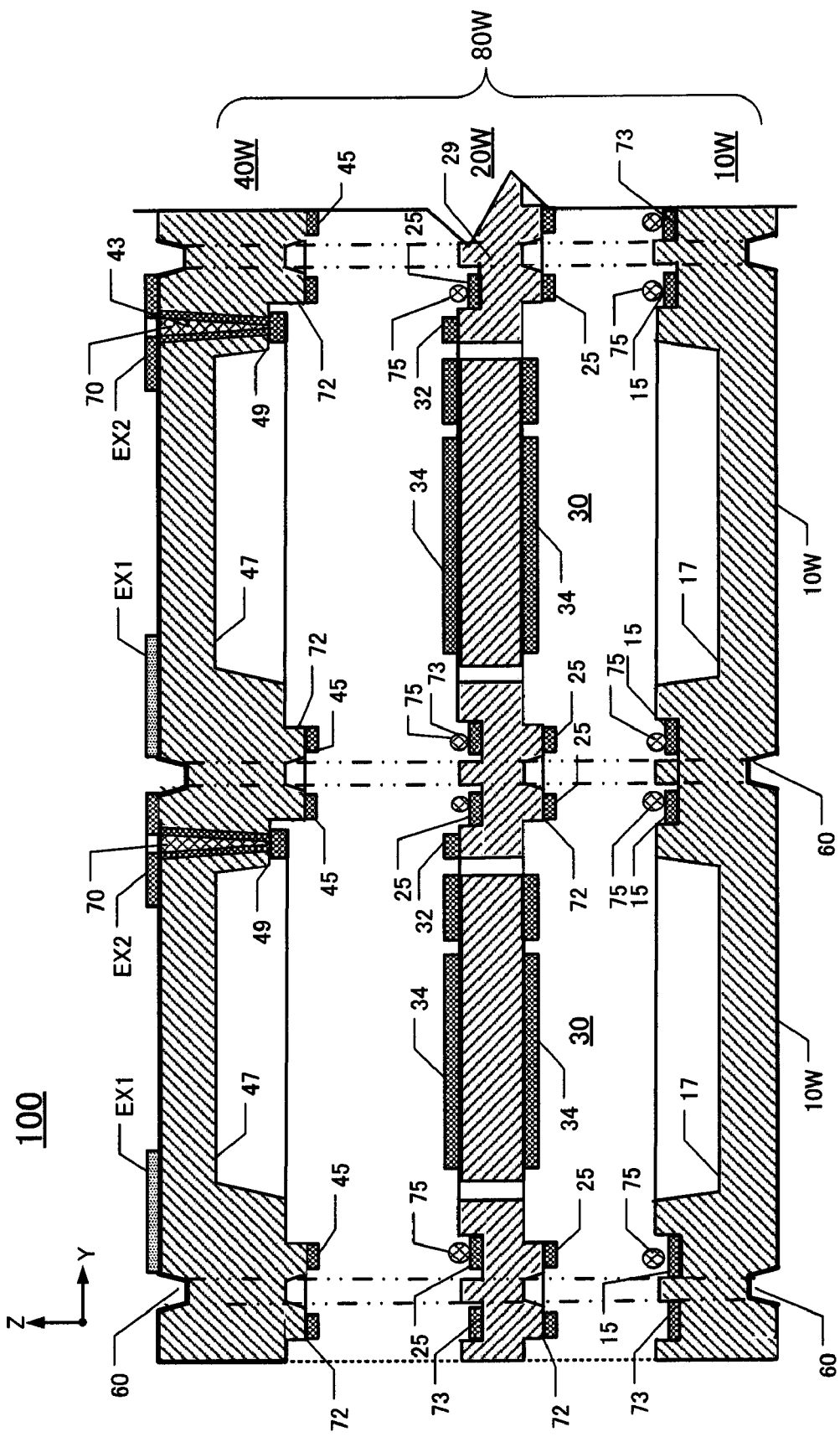
FIG. 3 is an enlarged elevational section along the line B-B of FIG. 2, showing a portion of the package wafer before actually bonding the three constituent wafers together.

The invention is described below in the context of representative embodiments that are not intended to be limiting in any way.

First Embodiment of a Crystal Vibrating Device

FIG. 1A is a plan view of the inner surface of a lid 10 of this embodiment of a crystal vibrating device 100. FIG. 1B is a plan view of the crystal frame 20 of this embodiment, wherein the crystal frame 20 comprises a tuning-fork type crystal vibrating piece 30. FIG. 1C is a plan view of the inner surface of a base 40 of this embodiment. FIG. 1D is an elevational section along the line A-A in FIGS. 1A-1C, showing the crystal vibrating device 100. The crystal vibrating device 100 comprises a package including the crystal frame 20 sandwiched between the lid 10 and the base 40.

The lid 10 and base 40 are each made of glass, ceramic, or crystal (quartz crystal) material. The crystal frame 20 includes the tuning-fork type crystal vibrating piece 30, which has an outline profile formed by etching.

As shown in FIG. 1A, the lid 10 has a concavity 17 that faces the crystal frame 20. Around the periphery of the lid 10, facing the crystal frame 20, is a fitting concavity 73. The fitting concavity 73 includes a metal film 15 formed herein.

As shown in FIG. 1B, the crystal frame 20 comprises a tuning-fork type crystal vibrating piece 30, an outer frame 29, and a pair of supporting arms 26. These components are formed integrally, with the same thickness, on the crystal wafer 20W (see FIG. 2). The tuning-fork type crystal vibrating piece 30 comprises a pair of vibrating arms 21 and a base portion 23. Around the periphery of the outer frame 29 on the surface shown in FIG. 1B is a fitting convexity 72. Similarly, around the periphery of the outer frame 29 on the opposing surface is a fitting concavity 73. Thus, both major surfaces of the crystal frame 20 have respective fitting concavities. Each fitting concavity 72, 73 has a respective metal film 25 formed therein.

A first base electrode 31 and a second base electrode 32 are formed on the outer frame 29, the base 23, and the supporting arms 26 of the crystal frame 20. The vibrating arms 21 have a respective first excitation electrode 33 (on one vibrating arm) and a respective second excitation electrode 34 (on the other vibrating arm). On each vibrating arm 221, the respective excitation electrodes are provided on the upper, lower, and side surfaces thereof. The first excitation electrode 33 is connected to a first base electrode 31, and the second excitation electrode 34 is connected to a second base electrode 32. The tuning-fork type crystal vibrating piece 30 is very small, and oscillates at 32.768 kHz.

Each of the first base electrode 31, second base electrode 32, first excitation electrode 33, and second excitation electrode 34 comprises respective metal layers. Example metal layers are 400-2000 Ångstroms of gold (Au) layered on 150-700 Ångstroms of chromium (Cr).

The supporting arms 26 extend parallel to the vibrating arms 21 (in the Y-direction) from one end of the base 23, and connect to the outer frame 29. The supporting arms 26 reduce leakage of oscillations from the vibrating arms 21, oscillating inside of the package, to the exterior of the crystal vibrating device 100. The supporting arms 26 protect the device from adverse influences such as changes in external temperature and/or physical impacts from dropping the package.

As shown in FIG. 1C, the base 40 defines a concavity 47 that faces the crystal frame 20 in the package. The concavity 47, a first through-hole 41, and a second through-hole 43 are all formed concurrently by etching. The base 40 also includes step portions 49 used for connecting electrodes, specifically a first connecting electrode 42 and a second connecting electrode 44, formed thereon. On the under-surface of the base 40 are a first external electrode EX1 and a second external electrode EX2, both of which are metalized. Just inboard of the periphery of the base 40, facing the crystal frame 20, is a fitting convexity 72 that includes a metal film 45 formed therein.

The first and second through-holes 41, 43 each include an interior metal film. Each metal film is formed, simultaneously with formation of the first and second connecting electrodes 42, 44, by photolithography. The first connecting electrode 42 connects to the first external electrode EX1 on the under-surface of the base 40 via the first through-hole 41. The second connecting electrode 44 connects to the second external electrode EX2 on the under-surface of the base 40 via the second through-hole 43.

The first base electrode 31 and second base electrode 32, formed on the under-surface of the outer frame 29, connect respectively to the first connecting electrode 42 and second connecting electrode 44 formed on the upper surface of the base 40. I.e., the first base electrode 31 is electrically connected to the first external electrode EX1, and the second base electrode 32 is electrically connected to the second external electrode EX2.

The metal film 25 formed on the crystal frame 20 comprises a layer of gold (Au; 400 to 1500 Å thick) that may be formed on a layer of chromium (Cr; 150 to 700 Å thick). Specifically, whenever the lid and base are made of a crystal material, the metal films 15, 45 each include a gold layer formed on a chromium layer. Whenever the lid and base are made of glass or ceramic, the metal films 15, 45 each include only the gold layer.

As shown in FIG. 1D, a crystal vibrating device 100 is formed by layering together the lid 10 of FIG. 1A, the crystal frame 20 of FIG. 1B, and the base 40 of FIG. 1C. These parts, exclusive of the tuning-fork type crystal vibrating piece 30, are called the "package" 80. In FIG. 1D, each of these parts is illustrated separately for clarity of depiction. The first and second through-holes 41, 43 of the package 80 are sealed by a sealing material 70.

Further with respect to FIG. 1D, fitting steps are formed on the bonding faces of the lid 10, base 40, and crystal frame 20. More specifically, the fitting concavity 73 of the lid 10 fits into the fitting convexity 72 of the crystal frame 20, and the fitting convexity 72 of the base 40 fits into the fitting concavity 73 of the crystal frame 20.

In FIG. 1D the lid 10, base 40, and crystal frame 20 are not yet bonded together, but the figure indicates how these parts are aligned with each other for bonding. During actual manufacture, a single crystal wafer 20W on which hundreds or thousands of crystal frames 20 are formed (see FIG. 2), one lid wafer 10W on which hundreds or thousands of lids 20 are formed (see FIG. 3), and a base wafer 40W on which hundreds or thousands of bases 40 are formed (see FIG. 3) are aligned, layered (with the crystal wafer being sandwiched between the base and lid wafers), and bonded together to form hundreds or thousands of crystal vibrating devices 100 simultaneously. The three-layer sandwich thus formed is called a package wafer 80W.

FIG. 2 is a top plan view of a package wafer 80W, as viewed from the lid wafer side. The lid wafer 10W is depicted as if it were transparent, and the figure mainly shows the tuning-fork type crystal vibrating pieces 30 formed on the crystal wafer 20W. For comprehension, an area corresponding to the section of one crystal vibrating device 100 is denoted with a virtual line (two-dotted chain line) on the package wafer 80W. Also, voids 22 are depicted as meshed zones to distinguish the tuning-fork type vibrating piece 30 and the outer frame 29.

Further with respect to FIG. 2, cutting grooves 60 are formed on the lid wafer 10W. Cutting grooves 60 are also formed on the base wafer 40W (see FIG. 3) aligned (in the X-Y plane) with the cutting grooves on the lid wafer 10W (X-Y plane). The package wafer 80W is affixed to a dicing film, not shown, and cut using a dicing saw. The cutting grooves 60 are used for preventing formation of cracks on the crystal vibrating device 100 whenever the lid wafer 10W and the base wafer 40W are being cut by the dicing saw. During cutting the dicing saw moves linearly between the walls of the cutting grooves 60 of the lid wafer 10W and the base wafer 40W. The depth of each cutting groove 60 is in the range of 20 to 40 μm.

Continuing further with FIG. 2, the metal film 15 formed on the lid wafer 10W, the metal film 25 formed on the crystal wafer 20W, and the metal film 45 formed on the base wafer 40W are situated so as to become layered with each other in the X-Y plane. Thus, the fitting concavity 73 of the lid 10 fits within the fitting convexity 72 of the crystal frame 20. The metal films 15, 25, and 45 are positioned so that they do not extend into the cutting grooves 60. This avoids the cutting saw from cutting into the metal forms, which prevents formation of metal chips that could attach to the blade of dicing saw.

FIG. 3 is an enlarged elevational section, along the line B-B, of a portion of the package wafer 80W. For comprehension, an area corresponding to the size of one crystal vibrating device 100 is illustrated within a virtual line (two-dotted line) on the package wafer 80W. The package wafer 80W comprises a lid wafer 10W on which lids 10 are formed, a crystal wafer 20W on which crystal frames 20 are formed, and a base wafer 40W on which bases 40 are formed. FIG. 3 shows these portions of the package wafer 80W aligned with each other but not yet bonded together. In FIG. 3 the lid wafer 10W is situated below and the base wafer 40W is situated above so that they sandwich the crystal wafer 20W. On the lid wafer 10W and the base wafer 40W are respective cutting grooves 60 that are positioned according to the size of the crystal vibrating devices 100 formed between them.

On the inner surface of the lid wafer 10W a concavity 17 is formed by wet-etching. Also formed at the same time by wet-etching is the fitting concavity 73 on the lid wafer 10W, facing the crystal wafer 20W. On the outer (upper) surface of the lid wafer 10W, the cutting grooves 60 are formed. On the inner surface of the base wafer 40W, a concavity 47 and fitting convexity 72 are formed by wet-etching. On the outer surface (under-surface) of the base wafer 40W are formed the cutting grooves 60.

On the surface of the crystal wafer 20W facing the lid wafer 10W, the fitting convexity 72 is formed by wet-etching. On the surface of the crystal wafer 20W facing the base wafer 40W, the fitting concavity 73 is formed by wet-etching. The fitting concavity 73 formed on the lid wafer 10W fits with the fitting convexity 72 of the crystal wafer 20W. Similarly, the fitting convexity 72 formed on the base wafer 40W fits with the fitting concavity 73 of the crystal wafer 20W.

As shown in FIG. 3, the fitting concavity 73 of the lid wafer 10W includes the metal film 15. Similarly, the fitting convexity 72 and the fitting concavity 73 of the crystal wafer 20W include the metal film 25, and the fitting convexity 72 of the base wafer 40W includes the metal film 45.

A eutectic metal ball 75 can be placed in the fitting concavity 73 to maintain a temporary space between the metal layers 25, 45. After inserting the fitting convexity 72 into the fitting concavity 73, as the eutectic metal ball 75 melts, the molten eutectic metal flows along the metal films 15, 25, 45. I.e., the molten eutectic metal wets the surfaces of the metal film 15, 25, 45 by capillary action. When the molten eutectic metal cools, it hardens, resulting in bonding the metal films 15, 25 together and the metal films 25, 45 together. Thus, the package of the crystal vibrating device 100 of this embodiment is formed by interaction of the metal films 15, 25, 45.

The eutectic metal ball 75 desirably comprises a gold-silicon alloy ($Au_{3.15}Si$, wherein the percent w/w of Si is 3.15), a gold-germanium alloy ($Au_{12}Ge$), or a gold-tin alloy ($Au_{20}Sn$). The melting temperature of the gold-silicon alloy is 363° C., of the gold-germanium alloy is 356° C., and of the gold-tin alloy is 280° C.

The first through-hole 41 and second through-hole 43 are sealed using a sealing material 70. The sealing material 70 can be a eutectic, similar to the bonding material discussed above, namely a gold-silicone alloy, a gold-germanium alloy, or a gold-tin alloy. If the same eutectic is used for both sealing and bonding, both can be done simultaneously. For example, sealing of the through-holes and bonding together of respective wafers can be done at the same temperature by placing the packaged wafer 80W in a reflow furnace under a preselected vacuum or filled with a desired inert gas.

Alternatively, the sealing material and bonding material can be different. For example, a eutectic metal having a high melting temperature can be used first (e.g., for bonding), followed by use of a eutectic metal having a lower melting temperature (e.g., for sealing), since use of the second eutectic will not result in melting of the first eutectic.

Note that the cut regions between adjacent crystal vibrating devices 100 (indicated in FIG. 3 by two-dotted chain lines) do not extend into the metal films 15, 25, 45. Thus, the regions occupied by melted eutectic do not extend into cut regions, either. Hence, whenever the crystal vibrating devices 100 are being cut into individual devices by a dicing saw, the dicing saw does not cut the metal films. As a result, the dicing saw blade does not form chips or cracks on the package wafer 80W that otherwise would be caused by friction of the dicing saw with metals.

Since the lid wafer 10W and the base wafer 40W are provided with cutting grooves 60, the cutting load otherwise imposed on the dicing saw is reduced, which improves work efficiency. During dicing the lid wafer 10W and base wafer 40W are affixed to a dicing tape and then diced. The cutting grooves prevent metal chips from interfering with the lid wafer 10W and base wafer 40W.

Second Embodiment of a Crystal Vibrating Device

Figure 4:
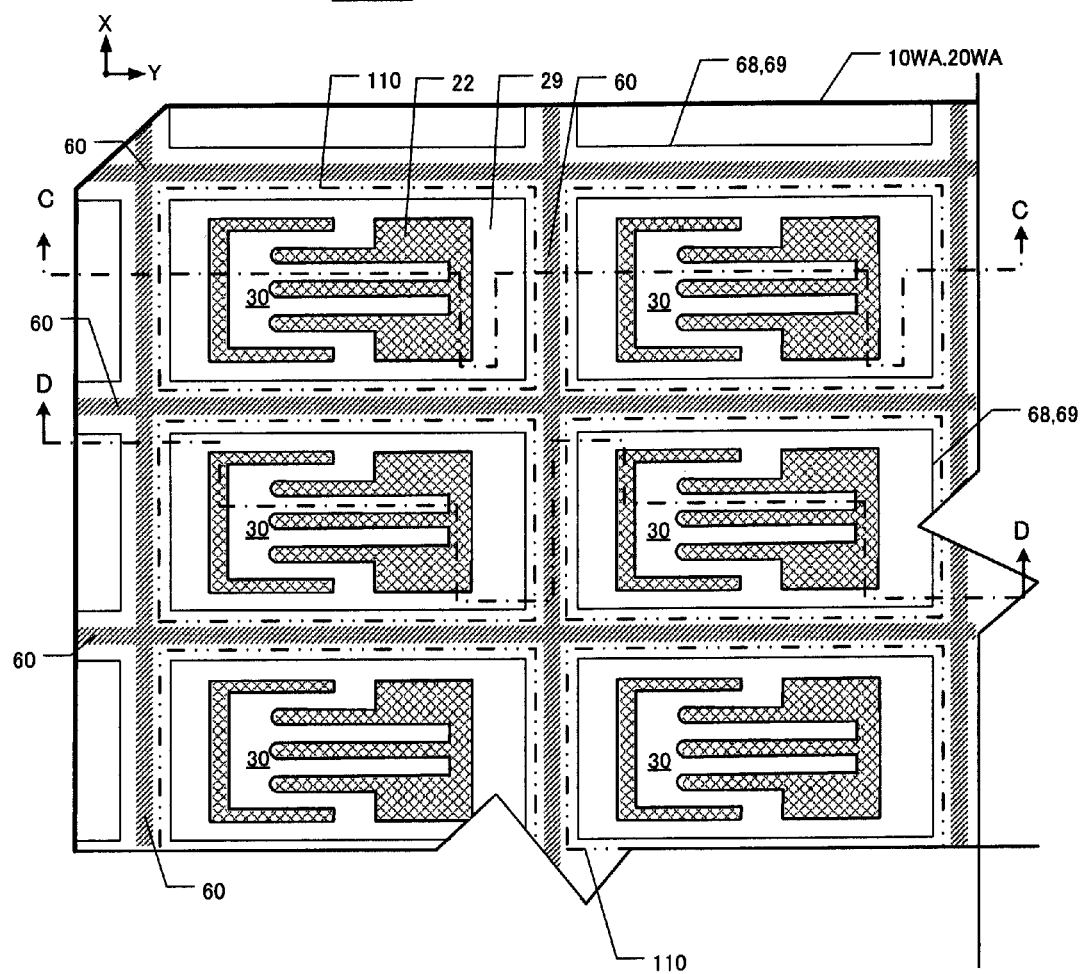
FIG. 4 is a plan view of a package wafer according to a second embodiment, as viewed from the lid side.

FIG. 4 is a top plan view of a package wafer 85W as viewed from the lid wafer 10WA. The lid wafer 10WA is shown as if it were transparent, revealing the underlying tuning-fork type crystal vibrating pieces 30 formed on the crystal wafer 20WA. For comprehension, the area corresponding to the profile of one crystal vibrating device 110 is delineated with a virtual line (two-dotted chain line) on the packaged wafer 85W. Also the voids 22 are denoted as meshed regions to distinguish them from the tuning-fork type vibrating piece 30 and the outer frame 29.

As shown in FIG. 4, cutting grooves 60 are provided on the lid wafer 10WA and on the base wafer 40WA at corresponding locations in the X-Y plane (see FIG. 5) as on the lid wafer 10WA. Fitting concavities 68 and fitting convexities 69 are denoted by solid lines in a region corresponding to the profile of one crystal vibrating device 110.

FIG. 5 is an enlarged elevational section, along the line C-C in FIG. 4, of a package wafer 85W including a crystal vibrating device 110. In FIG. 5 the wafers are aligned but not yet brought into contact with each other. In this embodiment a resin (e.g., epoxy resin) is used as a bonding material for forming the package of the crystal vibrating device 110. For comprehension of FIG. 5, areas corresponding to the size of respective crystal vibrating devices 110 are delineated with virtual lines (two-dotted chain lines) on the package wafer 85W.

As shown in FIG. 5, the package wafer 85W comprises a lid wafer 10WA, on which individual lids 10A are formed, a crystal wafer 20WA, on which individual crystal frames 20A are formed, and a base wafer 40WA on which bases 40A are formed. For comprehension, FIG. 5 depicts shows the package wafer 85WA in which the constituent wafer are aligned but not yet bonded together. In FIG. 5, the lid wafer 10WA is at the bottom and the base wafer 40WA at the top, with the crystal wafer 30WA being sandwiched therebetween. On the lid wafer 10WA and base wafer 40WA are cutting grooves 60 placed according to the sizes of the crystal vibrating devices.

A concavity 17 is formed by wet-etching the inner surface of the lid wafer 10WA. At the same time, the fitting concavity 68 facing the crystal wafer 20WA can also be formed on the lid wafer 10WA by wet-etching. On the opposite surface of the lid wafer 10WA (i.e., on the outer surface) are the cutting grooves 60. Also on the base wafer 40WA, a concavity 47 and the fitting convexity 69 are formed by wet etching. The cutting grooves 60 are spaced apart according to the size of the crystal vibrating device 110, and are formed by wet-etching the base wafer 40WA as well.

On the surface of the crystal wafer 20WA facing the lid wafer 10WA, fitting convexities 69 are formed by wet-etching. Similarly, on the opposite surface, fitting concavities 68 are formed by wet-etching. The fitting concavity 68 on the lid wafer 10WA receives the fitting convexity 69 formed on the crystal wafer 20WA. Similarly, the fitting convexity 69 formed on the base wafer 40WA fits into the fitting concavity 68 formed on the crystal wafer 20WA. Metal films are not formed on the fitting convexities 69 or fitting concavities 68 because bonding the wafers of the crystal vibrating devices 110 together is simply performed using a resin (e.g., epoxy resin). Other resins that could be used include silicone resins and polyimide resins, or combinations thereof.

Method for Manufacturing Crystal Vibrating Device of Second Embodiment

FIGS. 6A, 6B, 6C, and 6D are enlarged elevational sections along the line D-D in FIG. 4. These figures are of a package wafer 85W including the crystal vibrating device 110. FIGS. 6A-6D also show respective manufacturing steps for making the crystal vibrating device 110. Areas corresponding to the size of the crystal vibrating device 110 are delineated with virtual lines (two-dotted chain lines) on the package wafer 85W.

In FIG. 6A the lid wafer 10WA is shown on which the lids 10A are formed, the crystal wafer 20WA is shown on which crystal frames 20A having respective tuning-fork type crystal vibrating pieces 30 are formed, and the base wafer 40WA is shown on which the bases 40A are formed. The wafers are shown as respective layers that are aligned but not yet bonded together. The fitting concavities 68 of the wafers receive respective fitting convexities 69 and are bonded thereto. An adhesive is applied on the fitting concavities 68 so as not to be separated, resulting in layering of the three wafers.

On the lid wafer 10WA and base wafer 40WA are formed respective cutting grooves 60. The cutting grooves 60 are not required, but when present prevent cracking of the package wafer 85W during dicing.

The concavity 17 and the cutting grooves 60 on the lid 10A are formed by etching prior to bonding of the wafers together. Similarly, the concavity 47 and the cutting grooves 60 can be formed simultaneously by wet-etching. Also formable by wet-etching are the first connecting electrode 42 and second connecting electrode 44.

To bond together the mating surfaces of the lid wafer 10WA, crystal wafer 20WA, and base wafer 40WA, the wafers are first aligned, then bonded. Bonding is performed by application of epoxy resin on the bonding surfaces and bringing the wafers together to form a sandwich. During bonding the layered wafers desirably are pressed (in an air environment) to achieve strong bonds by the epoxy, thereby forming a package wafer 85W. During bonding, the first and second base electrodes 31, 32 (FIG. 5) and the first and second connecting electrodes 42, 44 are also bonded together strongly.

A unit of sealing material 70 is placed on each of the first and second through-holes 41, 43 of the package wafer 85W. The package wafer 85W is placed in a vacuum reflow furnace (not shown) providing a vacuum or inert-gas environment for sealing. The sealing material 70 can be gold-germanium alloy ($Au_{12}Ge$), which melts at 356° C.

FIG. 6B is an elevational section showing formation of a slit 87. The package wafer 85W is cut, using a dicing saw, along the cutting grooves, which forms the slit 87. The depth of the slit 87 extends through the region in which the fitting convexity 69 and fitting concavity 68 have been layered and bonded together. Considering the crystal vibrating device 110 not as a wafer but as an individual device, the slit 87 can be cut to the lower surface of the package wafer 85W, thereby releasing the crystal vibrating device 110.

FIG. 6C is an elevational section depicting formation of a corrosion-resistant film 90. The corrosion-resistant film 90 is formed on the package wafer 85W on the upper surface of the lids and in regions in which the slits 87 have been formed. The corrosion-resistant film 90 is formed by chemical vapor deposition (CVD) and physical vapor deposition (PVD) on the side surfaces and top surface of the package wafer 85W. The corrosion-resistant film 90 desirably is applied thickly to the side surfaces of the fitting convexity 69 and fitting concavity 68.

The corrosion-resistant film 90 can be formed of at least one of an inorganic oxide film, a nitride film, or a nitric oxide film. The film can be formed as a double-layer of inorganic oxide and nitride, respectively. The inorganic oxide film can be, for example, a silica ($SiO_2$) film, a titanium oxide ($TiO_2$) film, or an aluminum oxide ($Al_2O_3$) film. The nitride film can be a silicon nitride ($Si_3N_4$) film or an aluminum nitride (AlN) film. The nitride oxide film can be a silicone oxide nitride ($Si_2ON_2$) film.

The fitting convexity 69 and fitting concavity 68 of the crystal vibrating device 110 are bonded together using an adhesive, such as a resin (e.g., epoxy resin). Adhesives such as these tend to exhibit adhesion degradation over time. This results in difficulty of keeping the interior of the crystal vibrating device 110 in a vacuum state or filled with a desired concentration of inert gas for long periods of time. Use of the corrosion-resistant film 90 overcomes this problem so that the inside of the crystal vibrating device 110 can be kept at a vacuum or at a desired concentration of inert gas for long periods.

Chemical vapor deposition (CVD) is a method by which a thin film is deposited through deposition, reaction, and desorption on a surface of a substrate after applying energy, such as plasma, to components of thin films provided as gases to form intermediate products of the gas. Physical vapor deposition (PVD) is a method by which a thin film can be deposited on a substrate by evaporating a material to be deposited with energy, such as heat or plasma. Typical PVD methods include vacuum deposition and sputtering.

FIG. 6D is an elevational section of crystal vibrating devices 110 that have been cut into individual devices. A cut region 96 is formed by a dicing saw that is narrower than the slit 87 along the length of the slit 87. Thus, the package wafer 85W is cut into many individual crystal vibrating devices 110 by dicing.

FIGS. 6A and 6B show that the slit 87 is formed on the package wafer 85W after the first and second through-holes 41, 43 have been sealed by the sealing material 70. But, this is not intended to be limiting. Alternatively, for example, the package wafer 85W can be sealed in a vacuum or inert-gas atmosphere after the slit 87 and the corrosion-resistant film 90 have been formed.

Preferred embodiments of the present invention, including the crystal vibrating devices 100 and 110, are described above. According to these embodiments, the air-tightness of the devices is improved by forming the package with fitting members on the lid, the piezoelectric frame, and the base. Also, the embodiments are described in the context of tuning-fork type crystal resonator having vibrating arms on which grooves are not formed. However, it will be understood that the resonator alternatively can have vibrating arms with grooves or can be configured as crystal resonator using AT-cut crystal units exhibiting "thickness shear vibration." Furthermore, any of various combinations of shapes of bonding surfaces, fitting members, and bonding materials can be used.

What is claimed is:

1. A piezoelectric vibrating device, comprising:
   a piezoelectric frame comprising a piezoelectric vibrating piece, on which excitation electrodes are formed, and a frame portion surrounding the piezoelectric vibrating piece, the frame portion including first fitting members; and
   a plate bonded to one surface of the frame portion, the plate including second fitting members;
   wherein the first and second fitting members are physically engaged with each other and are bonded together using a bonding material.

2. The piezoelectric vibrating device of claim 1, wherein:
   the bonding material comprises at least one metal;
   the first and second fitting members each include a metal film; and
   the first and second fitting members are bonded together by the bonding material adhering to the metal films.

3. The piezoelectric vibrating device of claim 2, wherein the plate comprises at least one of a glass, a ceramic, or a piezoelectric material.

4. The piezoelectric vibrating device of claim 2, wherein the piezoelectric vibrating piece comprises an AT-cut crystal vibrating piece or a tuning-fork type crystal vibrating piece.

5. The piezoelectric vibrating device of claim 1, wherein the bonding material comprises a resin.

6. The piezoelectric vibrating device of claim 5, wherein the plate comprises at least one of a glass, ceramic, or a piezoelectric material.

7. The piezoelectric vibrating device of claim 5, wherein the piezoelectric vibrating piece comprises an AT-cut crystal vibrating piece or a tuning-fork type crystal vibrating piece.

8. The piezoelectric vibrating device of claim 5, further comprising a corrosion-resistant film formed on an exterior surface of the bonded-together piezoelectric vibrating device.

9. The piezoelectric vibrating device of claim 8, wherein the plate comprises at least one of a glass, a ceramic, or a piezoelectric material.

10. The piezoelectric vibrating device of claim 8, wherein the piezoelectric vibrating piece comprise an AT-cut crystal vibrating piece or a tuning-fork type crystal vibrating piece.

11. The piezoelectric vibrating device of claim 8, wherein the corrosion-resistant film comprises at least one of an inorganic oxide, a nitride, or a nitric oxide.

12. The piezoelectric vibrating device of claim 11, wherein the plate comprises at least one of a glass, a ceramic, or a piezoelectric material.

13. The piezoelectric vibrating device of claim 11, wherein the piezoelectric vibrating piece comprises an AT-cut crystal vibrating piece or a tuning-fork type crystal vibrating piece.

14. The piezoelectric vibrating device of claim 1, wherein the plate comprises at least one of a glass, a ceramic, or a piezoelectric material.

15. The piezoelectric vibrating device of claim 1, wherein the piezoelectric vibrating piece comprises an AT-cut crystal vibrating piece or a tuning-fork type crystal vibrating piece.

\* \* \* \* \*